United States Patent
Yuki et al.

[19]

[11] Patent Number: 5,888,852
[45] Date of Patent: Mar. 30, 1999

[54] METHOD FOR FORMING SEMICONDUCTOR MICROSTRUCTURE, SEMICONDUCTOR DEVICE FABRICATED USING THIS METHOD, METHOD FOR FABRICATING RESONANCE TUNNELING DEVICE, AND RESONANCE TUNNEL DEVICE FABRICATED BY THIS METHOD

[75] Inventors: Koichiro Yuki, Neyagawa; Kiyoyuki Morita, Yawata; Kiyoshi Morimoto, Hirakata; Yoshihiko Hirai, Osaka, all of Japan

[73] Assignee: Matsushita Electric Industrial Co., Ltd., Osaka, Japan

[21] Appl. No.: 808,580

[22] Filed: Feb. 28, 1997

[30] Foreign Application Priority Data

Mar. 1, 1996 [JP] Japan .................. 8-044492

[51] Int. Cl.$^6$ .................................... H01L 21/20
[52] U.S. Cl. .................... 438/141; 438/430; 438/962
[58] Field of Search .................. 438/50, 52, 53, 438/141, 480, 962

[56] References Cited

U.S. PATENT DOCUMENTS

| | | | |
|---|---|---|---|
| 4,696,098 | 9/1987 | Yen | 438/642 |
| 4,747,909 | 5/1988 | Kanazawa et al. | 438/653 |
| 4,900,695 | 2/1990 | Takahashi et al. | 438/625 |
| 5,244,828 | 9/1993 | Okada et al. | 438/962 |
| 5,405,454 | 4/1995 | Hirai et al. | 438/962 |
| 5,422,305 | 6/1995 | Seabaugh et al. | 438/480 |
| 5,453,398 | 9/1995 | Lee et al. | 438/962 |
| 5,514,614 | 5/1996 | Yuki et al. | 438/141 |

FOREIGN PATENT DOCUMENTS

| | | |
|---|---|---|
| 59-141227 | 8/1984 | Japan . |
| 61-116877 | 6/1986 | Japan . |
| 5-109606 | 4/1993 | Japan . |
| 7-312419 | 11/1995 | Japan . |

OTHER PUBLICATIONS

K. Kurihara et al., "Sub–10–nm Si Lines Fabricated Using Shifted Mask Patterns Controlled with Electron Beam Lithography and KOH Anisotropic Etching", *Jpn J. Appl. PHYS.*, vol. 35, Part 1, No. 12B, Dec., 1996, pp. 6668–6672.

K. Kurihara et al., "Sub–10–NM Si Lines Fabricated Using Shifted Mask Patterns Controlled with Beam Lithography and KOH Anisotropic Etching", *Microprocess*, pp. 212–213, Jul. 11, 1996.

*Primary Examiner*—Chandra Chaudhari
*Attorney, Agent, or Firm*—Ratner & Prestia

[57] ABSTRACT

The method for forming a semiconductor microstructure of this invention includes the steps of: forming a mask pattern having a first opening and a second opening on a substrate having a semiconductor layer as an upper portion thereof; and selectively etching the semiconductor layer using the mask pattern to form a semiconductor microstructure extending in a first direction parallel to a surface of the substrate, wherein, in the step of selectively etching the semiconductor layer, an etching rate in a second direction vertical to the first direction and parallel to the surface of the substrate is substantially zero with respect to an etching rate in the first direction, and a width of the semiconductor microstructure is substantially equal to a shortest distance between the first opening and the second opening in the second direction.

17 Claims, 14 Drawing Sheets

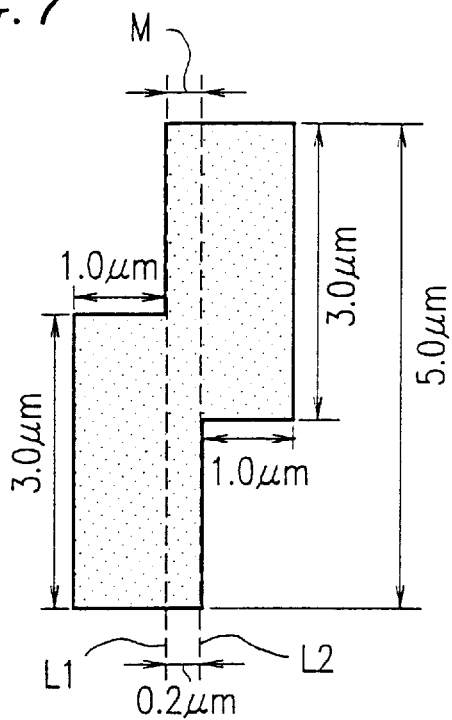

METHOD FOR FORMING SEMICONDUCTOR MICROSTRUCTURE, SEMICONDUCTOR DEVICE FABRICATED USING THIS METHOD, METHOD FOR FABRICATING RESONANCE TUNNELING DEVICE, AND RESONANCE TUNNEL DEVICE FABRICATED BY THIS METHOD

BACKGROUND OF THE INVENTION

1. Field of the Invention

The present invention relates to a method for forming a semiconductor microstructure and a method for fabricating a resonance tunneling device. More particularly, the present invention relates to a method for forming a silicon (Si) microstructure on an SIMOX (separation by implanted oxygen) substrate by use of crystal anisotropic etching and a method for fabricating a resonance tunneling device having such a silicon microstructure.

2. Description of the Related Art

In recent years, quantization functional devices utilizing a quantum effect have been studied and developed. Among these quantization functional devices, a resonance tunnel diode utilizing a resonance tunnel effect has been proposed and studied. A method for fabricating such a resonance tunnel diode is disclosed in Japanese Laid-Open Patent Publication No. 7-312419, where an etching mask having two etching windows which are close to each other and parallel to the <211> direction is formed on a (110) SIMOX substrate, and a narrow Si microstructure is formed under the etching mask by controlling an Si etching amount by crystal anisotropic etching, to be used as a quantum well of a resonance tunnel diode.

The above conventional method for forming a semiconductor microstructure has the following problems. First, due to limitations of the present alignment technique or an error in the measurement of the orientation of a substrate, the direction where the etching windows extend and the <211> direction of the substrate may not be strictly parallel, but may be deviated from each other to some extent. When the etching mask has long etching windows for the formation of a long Si microstructure, the etching proceeds toward a direction parallel to the <211> direction, finally reaching an edge of the etching mask, and thus an Si microstructure cut halfway may be formed.

Secondly, in the conventional lithographic technique, the space between the etching windows cannot be made so narrow for the reason of the limitation of the light wavelength. A very narrow space between the etching windows is also difficult for other reasons. For example, if the space is very narrow, extremely high a precision is required at the alignment in the subsequent lithographic step. A method employing electron beam drawing and the like has been proposed to overcome these problems. However, this method does not seem to be practical in consideration of the drawing cost and throughput. This method entails difficulty even when used for research.

Thirdly, in the conventional method for forming a semiconductor microstructure, though the width of the semiconductor microstructure is controlled by the etching amount, the etching amount is difficult to be monitored during etching.

Therefore, there is a strong need in the art for a method for fabricating a semiconductor microstructure and a resonance tunneling device which overcomes the above-mentioned problems associated with conventional methods.

SUMMARY OF THE INVENTION

The present invention provides a method for forming a semiconductor microstructure used as a quantum well of a resonance tunnel diode by a conventional lithographic technique at low cost and high throughput.

The present invention also provides a method for fabricating a resonance tunnel diode having such a semiconductor microstructure.

In particular, the present invention provides a method for forming a semiconductor microstructure with good controllability of the width thereof where the semiconductor microstructure is not cut halfway even if the lithographic alignment is deviated from the crystal orientation of a substrate to some extent.

The method for forming a semiconductor microstructure of this invention includes the steps of: forming a mask pattern having a first opening and a second opening on a substrate having a semiconductor layer as an upper portion thereof; and selectively etching the semiconductor layer using the mask pattern to form a semiconductor microstructure extending in a first direction parallel to a surface of the substrate, wherein, in the step of selectively etching the semiconductor layer, an etching rate in a second direction vertical to the first direction and parallel to the surface of the substrate is substantially zero with respect to an etching rate in the first direction, and a width of the semiconductor microstructure is substantially equal to a shortest distance between the first opening and the second opening in the second direction.

In one embodiment of the invention, the orientation of the substrate is (110), the first direction is <211>, and the second direction is <111>.

In another embodiment of the invention, the substrate is an SOI substrate.

In still another embodiment of the invention, the substrate is a SIMOX substrate.

In still another embodiment of the invention, the mask pattern has a stripe-shaped portion between the first opening and the second opening, and a length direction of the stripe-shaped portion does not correspond to the first direction.

In still another embodiment of the invention, the method further includes the step of forming a first oxide film and a second oxide film formed in parallel to each other in the first direction to sandwich the semiconductor layer, wherein, in the step of selectively etching the semiconductor layer, etching in the first direction is terminated by the first oxide film and the second oxide film.

In still another embodiment of the invention, the semiconductor layer is made of Si.

In still another embodiment of the invention, an oxide film is formed under the semiconductor layer of the substrate.

In still another embodiment of the invention, the step of selectively etching the semiconductor layer includes crystal anisotropic etching.

According to another aspect of the invention, a method for fabricating a resonance tunneling device including a silicon thin plate having side walls and a width thin enough to serve as a quantum well, a pair of tunnel barriers formed on the side walls of the silicon thin plate, and a pair of electrodes formed to sandwich the pair of tunnel barriers is provided. The silicon thin plate is formed in the steps of: forming an oxide film having a first opening and a second opening on a substrate having a silicon layer as an upper portion thereof;

and selectively etching the silicon layer using the oxide film as a mask to form the silicon thin plate extending in a first direction parallel to a surface of the substrate, wherein, in the step of selectively etching the silicon layer, an etching rate in a second direction vertical to the first direction and parallel to the surface of the substrate is substantially zero with respect to an etching rate in the first direction, and a width of the silicon thin plate is substantially equal to a shortest distance between the first opening and the second opening in the second direction.

In one embodiment of the invention, the pair of electrodes are formed by dry etching using the oxide film as a mask in a self-alignment fashion.

According to still another aspect of the invention, a semiconductor device is provided. The device includes: a double barrier structure including a silicon thin plate having side walls and extending in a first direction, and a pair of first oxide films formed on the side walls of the silicon thin plate; and a second oxide film formed to cover the silicon thin plate, wherein the second oxide film has a first opening and a second opening, and a shortest distance between the first opening and the second opening in a second direction vertical to the first direction and parallel to a surface of the second oxide film is substantially equal to a width of the silicon thin plate in the second direction.

According to still another aspect of the invention, a resonance tunneling device is provided. The device includes: a silicon thin plate having side walls and a width thin enough to serve as a quantum well; a pair of tunnel barriers formed on the side walls of the silicon thin plate; a pair of electrodes formed to sandwich the pair of tunnel barriers; and an oxide film formed to cover the silicon thin plate, wherein the oxide film has a first opening and a second opening, and a shortest distance between the first opening and the second opening in a second direction vertical to the first direction and parallel to a surface of the second oxide film is substantially equal to a width of the silicon thin plate in the second direction.

Thus, the invention described herein makes possible the advantages of (1) providing a method for forming a semiconductor microstructure used as a quantum well of a resonance tunnel diode at low cost and high throughput, and (2) providing a method for fabricating a resonance tunnel diode having such a semiconductor microstructure.

These and other advantages of the present invention will become apparent to those skilled in the art upon reading and understanding the following detailed description with reference to the accompanying figures.

BRIEF DESCRIPTION OF THE DRAWINGS

FIG. 1A is a plan view, FIG. 1B is a perspective view, and FIG. 1C and 1D are sectional views taken along line 1C—1C and line 1D—1D of FIG. 1A, respectively.

FIG. 7 shows the size of a typical etching mask used in the method according to the present invention.

FIG. 11A is a perspective view, FIG. 11B is a sectional view, and FIG. 11C is a plan view.

DESCRIPTION OF THE PREFERRED EMBODIMENTS (EXAMPLE 1)

A method for forming a semiconductor microstructure of Example 1 according to the present invention will be described. The method employs crystal anisotropic etching.

Figure 1A:
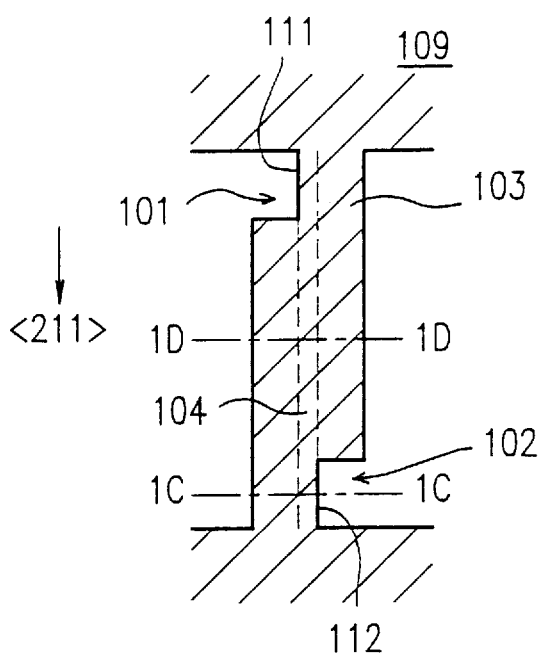
FIGS. 1A to 1D show a semiconductor microstructure formed by a method of Example 1 in accordance with the present invention.
Figure 1B:
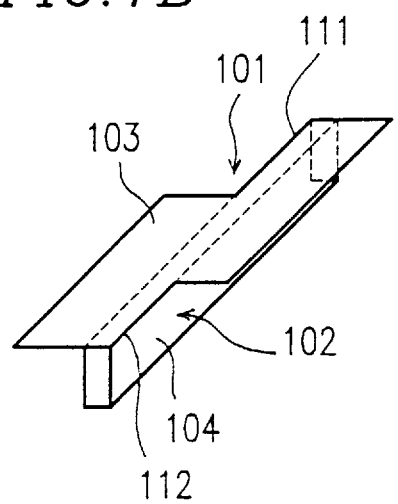
Figure 1C:
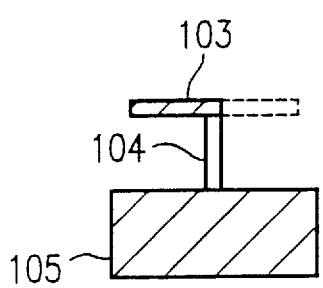
Figure 1D:
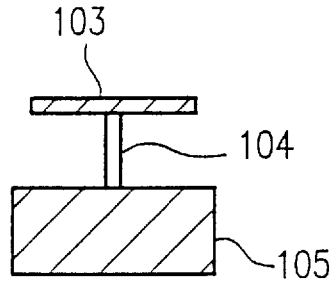

FIGS. 1A to 1D show a semiconductor microstructure 104 formed by the method of this example and an etching mask 109 used for forming the semiconductor microstructure. FIG. 1A is a plan view observed from above the semiconductor microstructure 104. FIG. 1B is a perspective view observed at an angle of about 30° from the position of FIG. 1A. FIGS. 1C and 1D are sectional views taken along line 1C—1C and line 1D—1D of FIG. 1A, respectively.

The semiconductor microstructure 104 is an elongate structure as shown in FIGS. 1A and 1B formed in the upper portion of a SIMOX substrate. The SIMOX substrate is composed of an upper silicon layer (SOI layer), a buried oxide layer, and a lower silicon layer (Si substrate). The semiconductor microstructure 104 is formed by etching the upper silicon layer of the SIMOX substrate. Only a buried oxide layer 105 of the SIMOX substrate is shown in FIGS. 1C and 1D as a substrate.

The etching mask 109 used for forming the semiconductor microstructure 104 includes a section 103 of an elongate shape as a whole, which is hereinbelow referred to as an "etching control section" of the etching mask. The etching control section 103 has a first cut 101 and a second cut 102. The semiconductor microstructure 104 has side edges which are located a little inside of ends 111 and 112 of the first and second cuts 101 and 102, respectively.

The method for forming the semiconductor microstructure 104 by crystal anisotropic etching of this example will be described with reference to FIGS. 2A to 2C, 3A to 3C, 4A to 4C, and 5A to 5C.

Figure 2A:
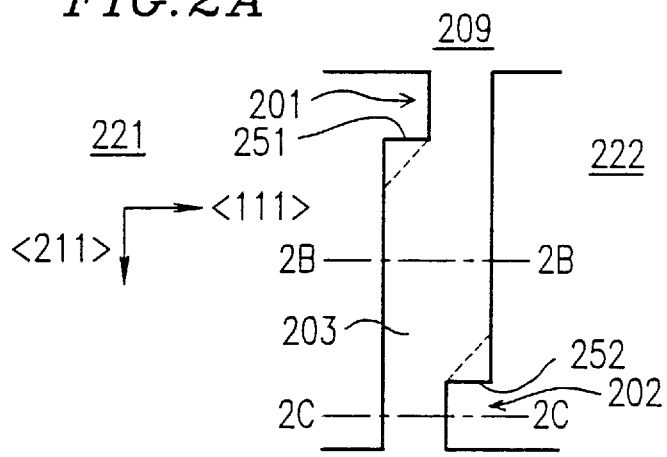
FIG. 2A is a plan view illustrating a stage of crystal anisotropic etching of the method of Example 1 according to the present invention.
Figure 2B:
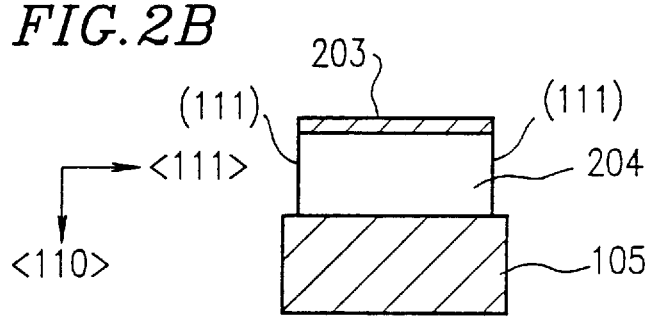
FIGS. 2B and 2C are sectional views taken along line 2B—2B and line 2C—2C of FIG. 2A, respectively.
Figure 2C:
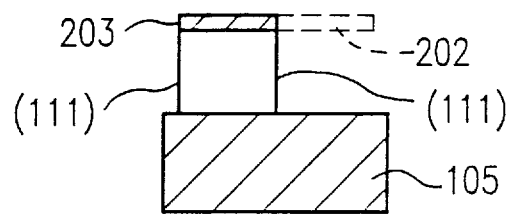
Figure 3A:
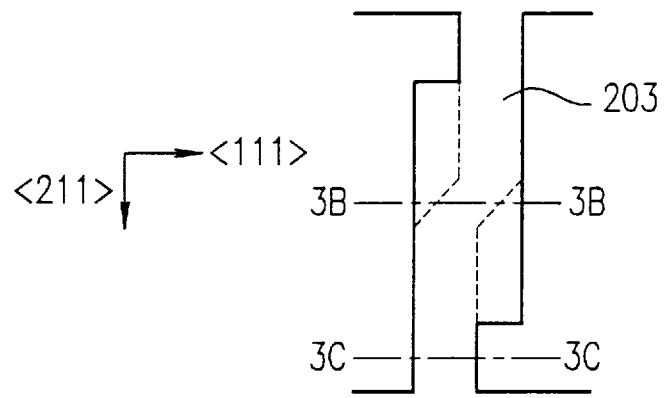
FIG. 3A is a plan view illustrating another stage of crystal anisotropic etching of the method of Example 1 according to the present invention.
Figure 3B:
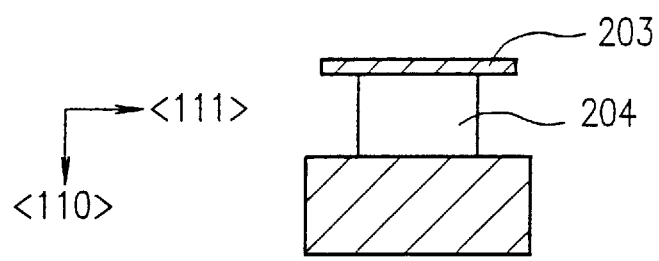
FIGS. 3B and 3C are sectional views taken along line 3B—3B and line 3C—3C of FIG. 3A, respectively.
Figure 3C:
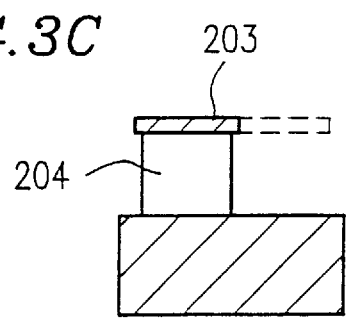
Figure 4A:
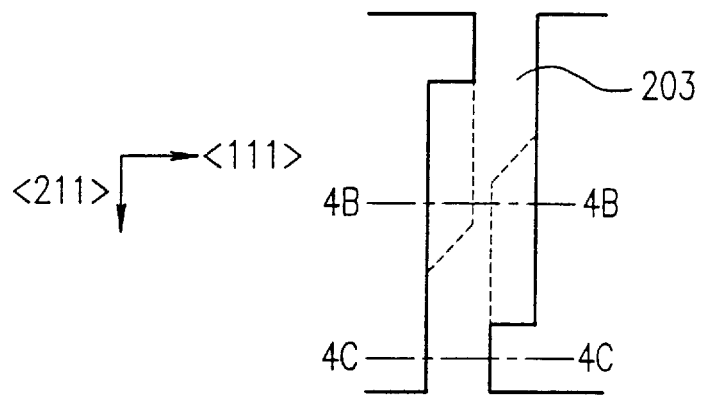
FIG. 4A is a plan view illustrating yet another stage of crystal anisotropic etching of the method of Example 1 according to the present invention.
Figure 4B:
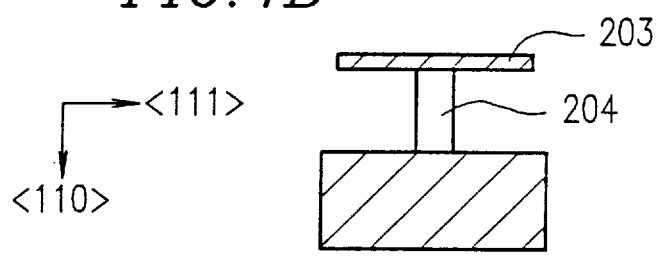
FIGS. 4B and 4C are sectional views taken along line 4B—4B and line 4C—4C of FIG. 4A, respectively.
Figure 4C:
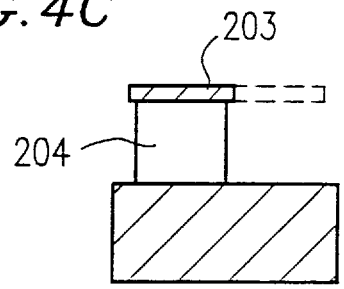

FIG. 2A is a plan view observed from above an etching control section 203 of an etching mask 209. FIGS. 2B and 2C are sectional views taken along line 2B—2B and line 2C—2C of FIG. 2A, respectively.

An n-type SIMOX substrate composed of a lower silicon layer (not shown), the buried oxide layer 105 (thickness: about 400 nm), and an upper silicon layer 204 (thickness: about 200 nm) is used as the substrate. The SIMOX substrate has a (110) orientation and a <211> direction in orientation flatness. The resistivity of the SIMOX substrate before the formation of the oxide layer is about 10 to 20 Ωcm.

The upper silicon layer 204 is completely oxidized to the bottom thereof in contact with the buried oxide layer 105 by a thermal oxidation film formation (LOCOS formation) process used in normal Si processing, except for one rectangular region with a size of about 10 μm in width and about 21 μm in length. Each of the resultant rectangular regions constitutes a device region completely isolated from the surroundings.

Thereafter, a silicon oxide film with a thickness of about 75 nm is formed on the device region by pyro-oxidation at about 900° C. for about 25 minutes. A resist with a thickness of about 1.5 μm is formed on the silicon oxide film, and exposed to light and developed with a gray stepper, so that the silicon oxide film is patterned by dry etching. By this patterning, the etching mask 209 having etching windows (openings) 221 and 222 on both sides of the device region is formed from the silicon oxide film. The etching mask 209 has a stripe-shaped etching control section 203 between the openings 221 and 222. The etching control section 203 has cuts 201 and 202 formed on the opposite sides at the ends thereof.

After the resist is removed, crystal anisotropic etching is performed at a temperature of about 80° C. with a mixture of ethylenediamine, pyrocatechol, and water (mixing ratio: about 6:1:2). The crystal anisotropic etching process will be described in detail.

Since the etching in the <110> direction is about 100 times faster than that in the <111> direction, walls which are in contact with the cuts 201 and 202 and parallel to the (111) orientation are formed under the etching control section 203 in a short time. Thus, as shown in FIGS. 2B and 2C, uniform (111) walls are formed along the edges of the etching control section 203.

The etching rate in the <211> direction (about 1500 nm/min.) is extremely (about 200 times) higher than that in the <111> direction (about 7 nm/min.). Accordingly, etching proceeds from an edge 251 of the cut 201 and an edge 252 of the cut 202 toward the center of the etching control section 203 as shown by the dotted lines in FIG. 2A, substantially simultaneously with the etching in the <110> direction. The etching in the <111> direction (second direction) hardly proceeds since it is extremely slower compared with the etching in the <211> direction (first direction). In other words, in the etching process, the etching rate in the second direction which is vertical to the first direction and parallel to the surface of the substrate is substantially zero with respect to the etching rate in the first direction.

Stages on the way of the crystal anisotropic etching are shown in FIGS. 3A to 3C and 4A to 4C which respectively correspond to FIGS. 2A to 2C. Thus, by this crystal anisotropic etching, the semiconductor microstructure 104 as shown in FIGS. 5A to 5C is formed.

The width M of the semiconductor microstructure 104 can be easily controlled by adjusting the size of the etching control section 203 of the etching mask 209. Referring to FIG. 5A, assume that straight lines L1 and L2 which are in level with an end 261 of the cut 201 and an end 262 of the cut 202, respectively, and parallel to the <211> direction are drawn. The straight lines L1 and L2 substantially overlap both side edges of the semiconductor microstructure 104. A distance M between the straight lines L1 and L2 (i.e., the shortest distance between the openings 221 and 222 in the <111> direction) determines a width m of the semiconductor microstructure 104. In this example, the distance M was set at about 0.2 μm to obtain the semiconductor microstructure 104 with the width m of about 0.2 μm. More specifically, the width m of the resultant semiconductor microstructure 104 is a little smaller than 0.2 μm since the etching in the <111> direction proceeds a little. However, the error is only about 30 nm which can be neglected. Herein, therefore, the width m of the semiconductor microstructure 104 is considered substantially equal to the distance M. The etching amount in the depth direction can also be easily controlled by use of the SIMOX substrate including the buried oxide layer 105. Thus, the semiconductor microstructure 104 with a height of about 165 nm can be obtained.

Figure 5A:
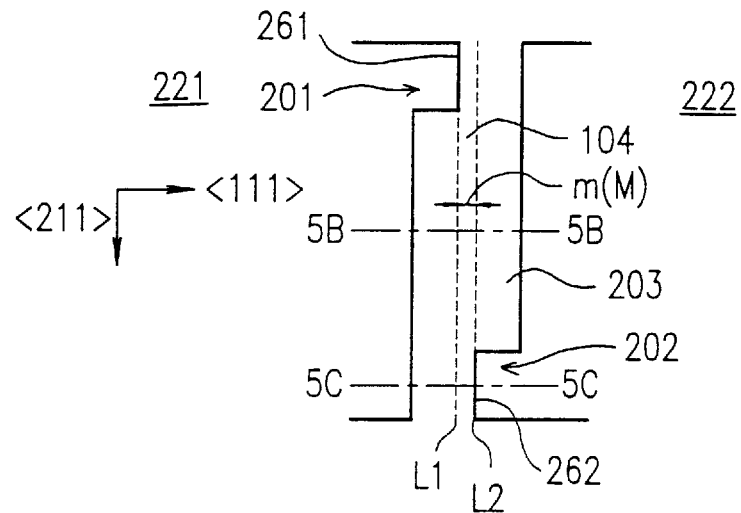
FIG. 5A is a plan view illustrating the final stage of crystal anisotropic etching of the method of Example 1 according to the present invention.
Figure 5B:
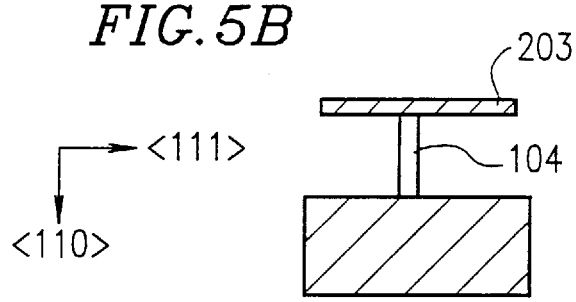
FIGS. 5B and 5C are sectional views taken along line 5B—5B and line 5C—5C of FIG. 5A, respectively.
Figure 5C:
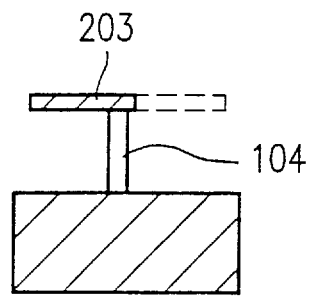
Figure 6A:
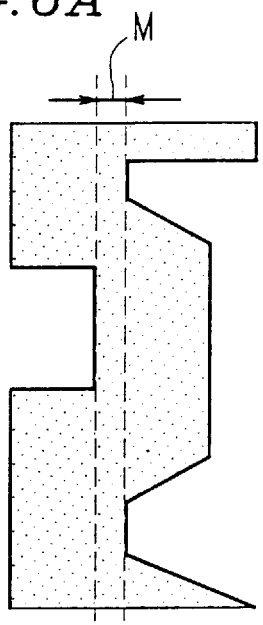
FIGS. 6A to 6D show etching masks used in the method according to the present invention.
Figure 6B:
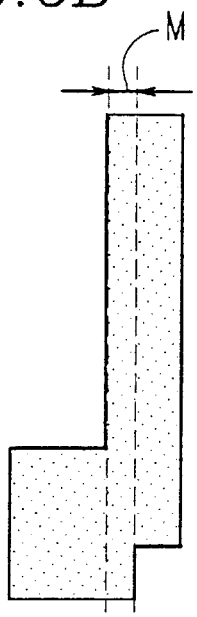
Figure 6C:
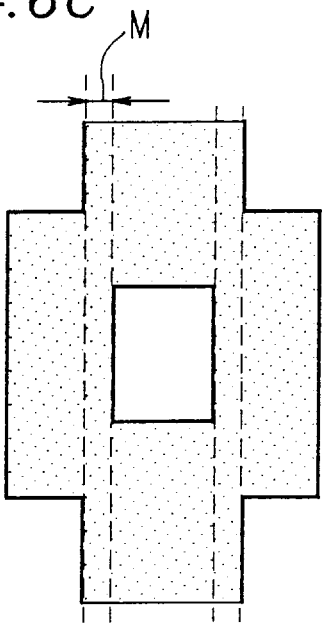
Figure 6D:
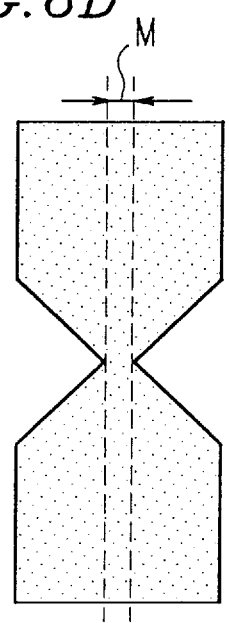

Etching masks having etching control sections as shown in FIGS. 6A to 6D and FIG. 7 may be used, instead of the etching mask having the etching control section 203 shown in FIG. 5A. A distance M shown in these figures corresponds to the distance M between the straight lines L1 and L2 in FIG. 5A. By adjusting the distance M, the width of the resultant semiconductor microstructure can be easily controlled. FIG. 7 shows a typical size of the etching control section of the etching mask used for the crystal anisotropic etching.

Thus, according to the present invention, a very narrow semiconductor microstructure can be formed by only controlling the shape of the etching mask without being affected by the etching rate.

The (111) walls can be formed in a short time by fast etching in the <211> direction while the etching in the <111> direction is slow. Accordingly, a large temporal margin can be secured after the semiconductor microstructure is completed. That is, when the etching process cannot be terminated immediately after the completion of the semiconductor microstructure, trouble such as cutting of the completed semiconductor microstructure and failure in obtaining a desired width due to continuing etching in the <111> direction can be prevented.

Figure 8:
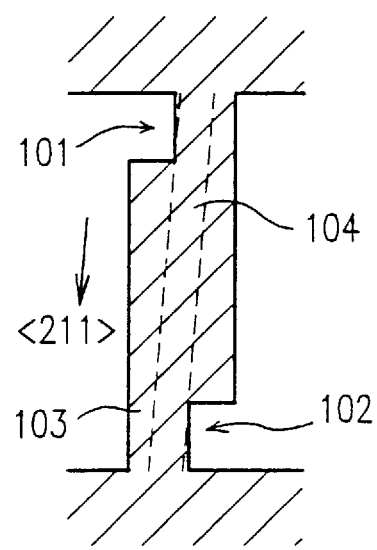
FIG. 8 is a plan view of another semiconductor microstructure formed by the method according to the present invention.

Even if an angular error arises in the alignment of the etching mask with the orientation of the substrate, the semiconductor microstructure 104 can be formed without being cut halfway, though it is inclined with respect to the etching control section 103 as shown in FIG. 8. This is because, since the cuts are formed on the opposite sides of the etching control section 103, etching proceeds from these cuts in the <211> direction of the substrate.

In this example, SIMOX was used as the substrate. Alternatively, an SOI (silicon on insulator) substrate, an Si substrate, or a GaAs or InP substrate with a silicon layer formed thereon may be used.

(EXAMPLE 2)

Referring to FIGS. 9A to 9D, a method for forming a semiconductor microstructure of Example 2 will be described. In this method, etching stop layers are formed to control the length of the semiconductor microstructure, in addition to the method described in Example 1. FIGS. 9A to 9D are plan views observed from above a SIMOX substrate. Since the method of this example is basically the same as that described in Example 1, only points different from Example 1 will be described.

Figure 9A:
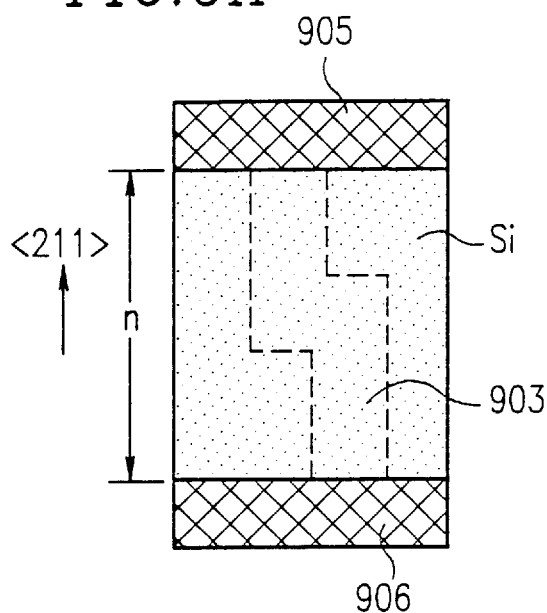
FIGS. 9A to 9D are plan views illustrating stages of crystal anisotropic etching of a method of Example 2 according to the present invention.

Referring to FIG. 9A, silicon oxide films 905 and 906 are formed by a thermal oxidation film formation process used in normal Si formation to isolate the region of the SIMOX substrate where the semiconductor microstructure 104 (see FIG. 9D) is to be formed. A distance n between the silicon oxide films 905 and 906 in the <211> direction determines the length of the semiconductor microstructure 104 to be formed. In this example, the distance n was set at about 5 $\mu$m, for example.

Figure 9B:
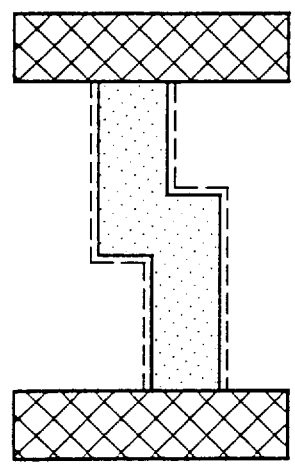
Figure 9C:
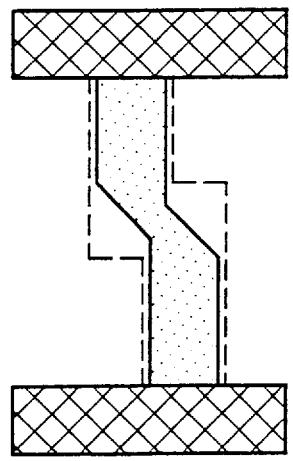
Figure 9D:
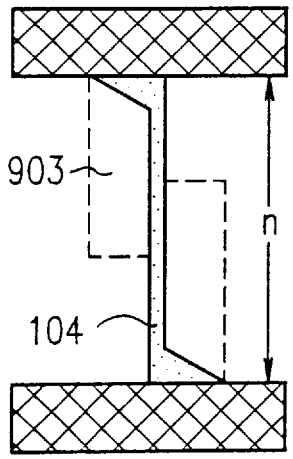

The formation of an etching mask having an etching control section 903 shown in FIG. 9A and the crystal anisotropic etching process are the same as those described in Example 1. The crystal anisotropic etching proceeds as shown in FIGS. 9B and 9C and is finally terminated by the silicon oxide films 905 and 906 as shown in FIG. 9D. As a result, the semiconductor microstructure 104 with a desired length (about 5 $\mu$m) corresponding to the distance n is formed.

Thus, in this example, by forming the silicon oxide films 905 and 906, the length of the semiconductor microstructure 104 can be controlled with high precision, and the device region can be isolated from adjacent device regions.

Figure 10A:
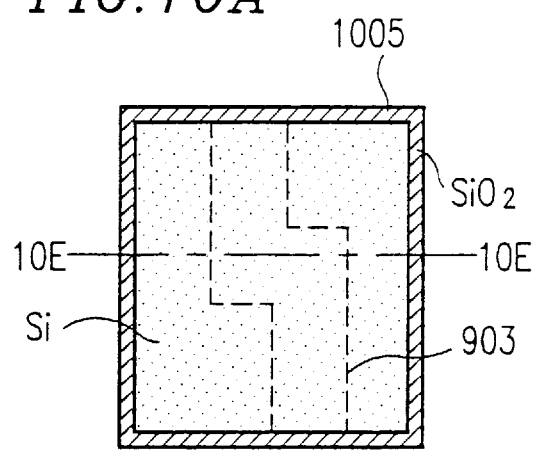
FIGS. 10A to 10D are plan views and FIG. 10E is a sectional view, illustrating stages of modified crystal anisotropic etching of the method of Example 2 according to the present invention.
Figure 10B:
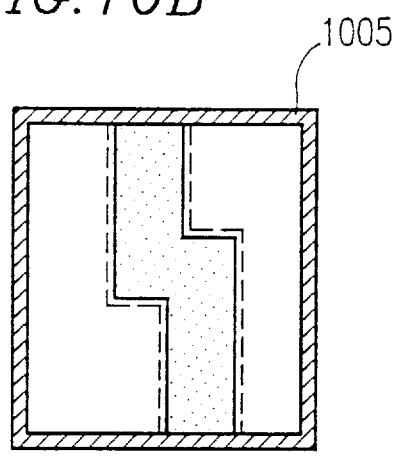
Figure 10C:
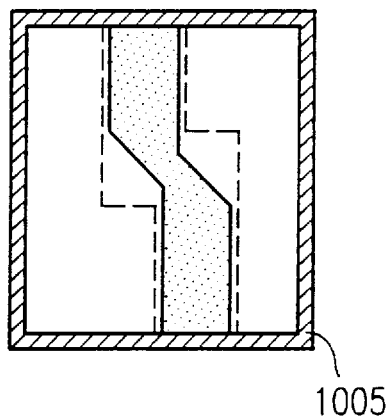
Figure 10D:
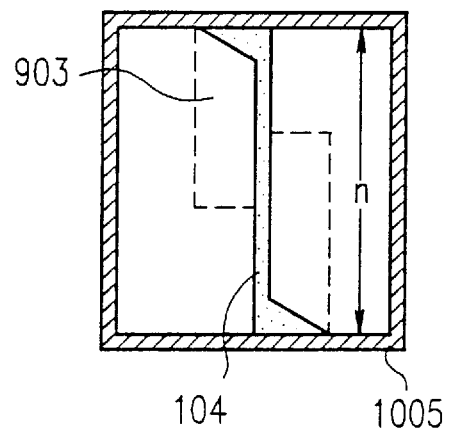
Figure 10E:
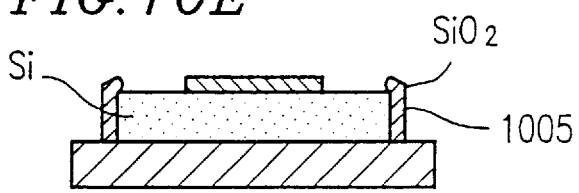

A silicon oxide film 1005 as shown in FIGS. 10A to 10E may be formed to completely surround the region where the semiconductor microstructure 104 is to be formed, instead of the silicon oxide films 905 and 906. FIG. 10E is a sectional view taken along line 10E—10E of FIG. 10A. The silicon oxide film 1005 can be formed in the following manner, for example. A silicon layer (SOI layer) formed on a silicon oxide layer or the like is patterned by dry-etching to form a silicon island. Then, a silicon oxide film is formed on the patterned silicon layer by thermal oxidation, and selectively removed by etching using a mask, to form the silicon oxide film 1005 as shown in FIG. 10E. The silicon oxide film 1005 may also be formed by a LOCOS formation method.

By using the silicon oxide film 1005 with the above structure, the device region can be completely isolated from adjacent device regions, thereby preventing current leakage. The crystal anisotropic etching process in this case is the same as that shown in FIGS. 9A to 9D.

Figure 14:
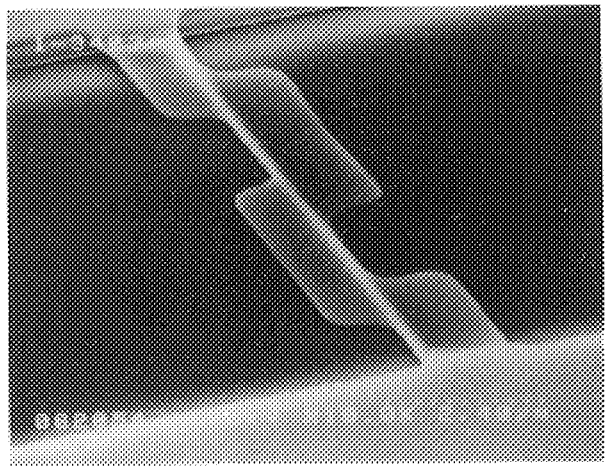
FIG. 14 is an SEM photograph of a semiconductor microstructure after the crystal anisotropic etching according to the present invention.

FIG. 14 is a photograph of the semiconductor microstructure taken by SEM (scanning electron microscopy) after the crystal anisotropic etching according to the methods of Examples 1 and 2.

(EXAMPLE 3)

Figure 11A:
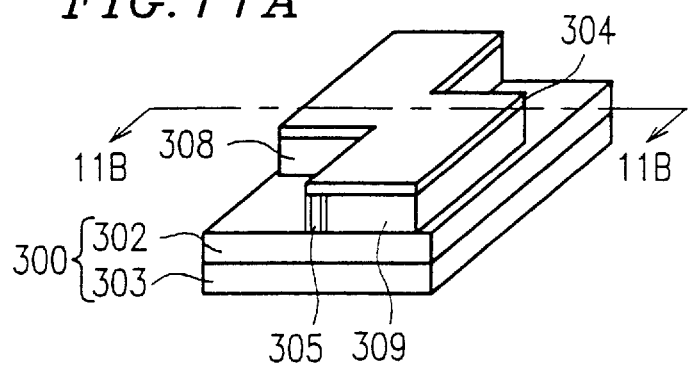
FIGS. 11A to 11C show a semiconductor device (resonance tunneling device) formed by a method of Example 3 according to the present invention.
Figure 11B:
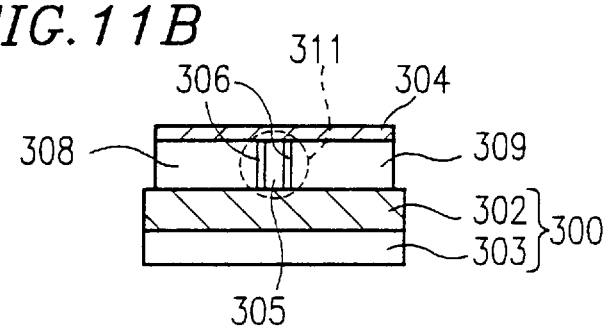
Figure 11C:
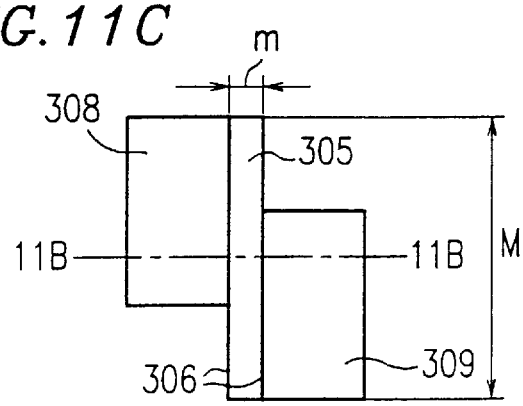

Referring to FIGS. 11A to 11C, a method for fabricating a semiconductor device of Example 3 will be described. More specifically, a method for fabricating a resonance tunneling device utilizing the resonance tunnel effect will be described.

FIG. 11A is a perspective view of a semiconductor device, FIG. 11B is a sectional view taken along line 11B—11B of FIG. 11A, and FIG. 11C is a plan view of the semiconductor device observed from above. As shown in FIGS. 11A and 11B, the semiconductor device is formed on a (110) SOI substrate 300 including a silicon substrate 303 and a buried silicon oxide layer 302 formed on the silicon substrate 303. A silicon thin plate (semiconductor microstructure) 305 is formed on the silicon oxide layer 302 by the crystal anisotropic etching process described in Examples 1 and 2. An etching mask 304 used for shaping the silicon thin plate 305 is formed on the silicon thin plate 305. Oxide barriers 306 are formed on both side walls of the silicon thin plate 305 as shown in FIG. 11B. A source 308 and a drain 309 are formed on the opposite sides of the silicon thin plate 305 in contact with the oxide barriers 306 under the etching mask 304. The silicon thin plate 305 is thus flanked by the silicon oxide barriers 306, forming a double barrier structure.

Figure 12:
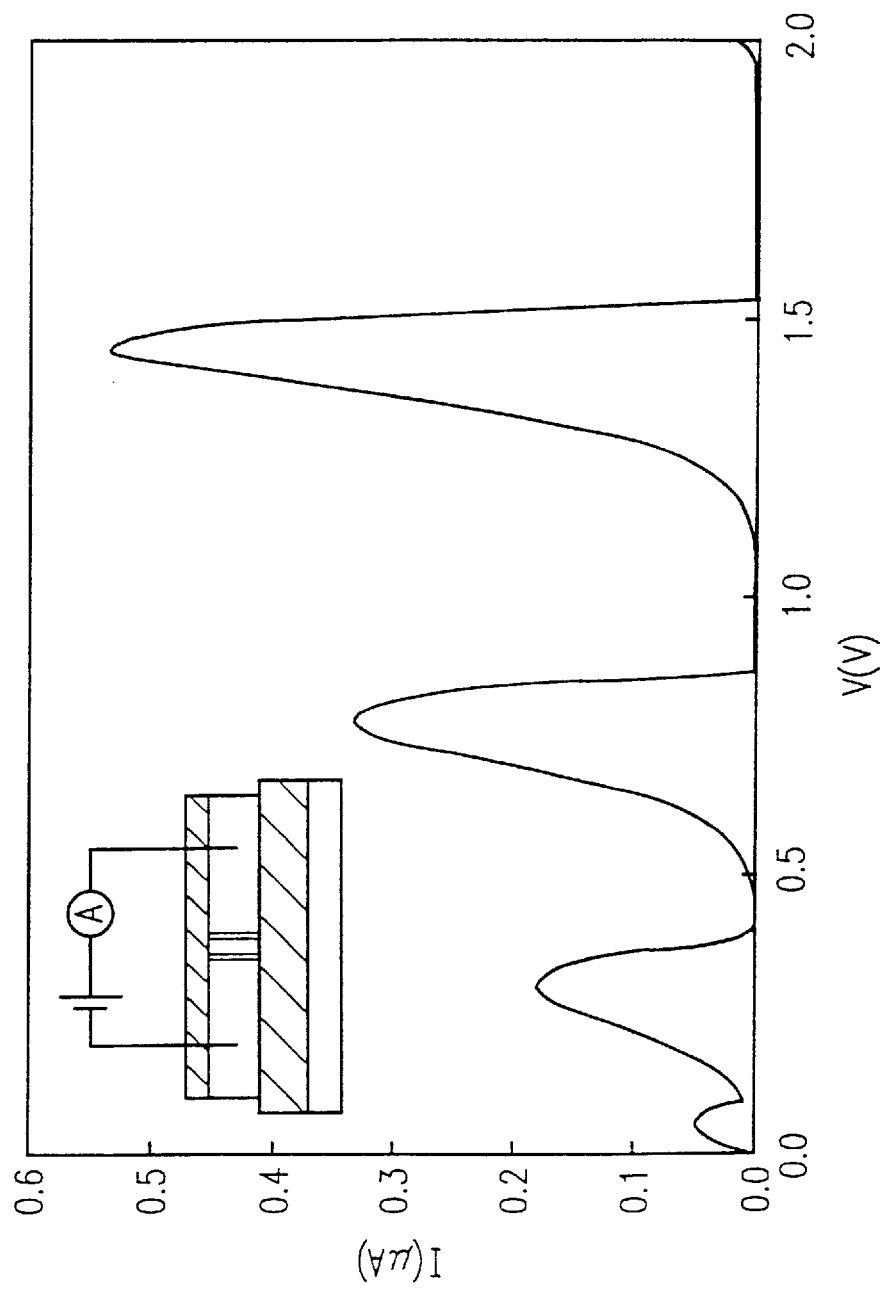
FIG. 12 is a graph showing the electric characteristics of the semiconductor device shown in FIGS. 11A to 11C.

FIG. 12 shows the electric characteristics of the semiconductor device shown in FIGS. 11A to 11C. As is observed from FIG. 12, the semiconductor device exhibits a so-called negative resistance where a current I is affected by the resonance tunnel effect thereby repeating increase and decrease by the application of a voltage to the drain 309 relative to the source 308.

Hereinbelow, the method for fabricating the resonance tunneling device of this example will be described with reference to FIGS. 13A to 13F which are perspective views illustrating the fabrication steps.

Figure 13A:
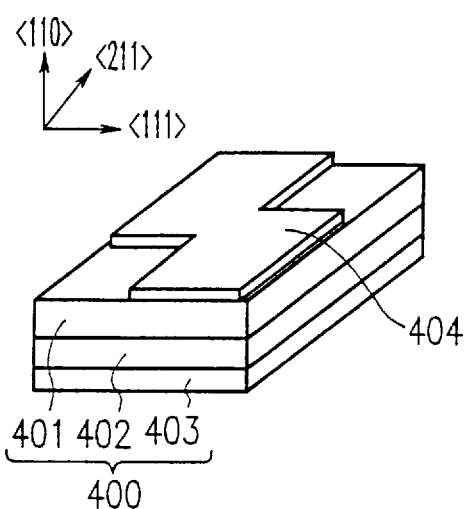
FIGS. 13A to 13F are perspective views illustrating steps for fabricating the semiconductor device shown in FIGS. 11A to 11C.

As shown in FIG. 13A, a mask 404 made of SiO$_2$ (thickness: about 75 nm) parallel to the <211> direction is formed on a (110) SOI substrate 400 composed of an upper silicon layer 401 (thickness: about 200 nm), a buried silicon oxide layer 402 (thickness: about 400 nm), and a (110) Si substrate 403. The mask 404 (etching control section) has a shape and size as shown in FIG. 7.

Figure 13B:
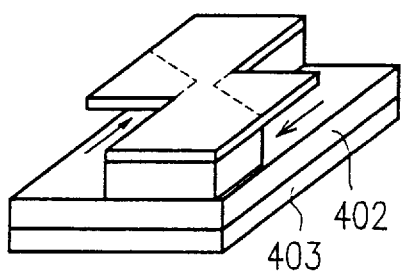
Figure 13C:
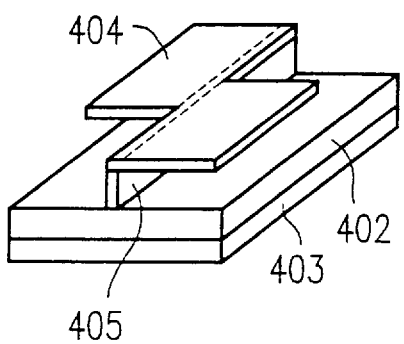

As shown in FIG. 13B, crystal anisotropic etching is performed with a mixture of ethylenediamine, pyrocatechol, and water (mixing ratio: about 6:1:2) at about 80° C. The crystal anisotropic etching proceeds in a direction shown by an arrow in FIG. 13B due to the orientation dependency of the etching rate, and finally, a silicon thin plate 405 (width: about 0.2 $\mu$m, length: about 5 $\mu$m, height: about 165 nm) having (111) side walls is formed under the mask 404 as shown in FIG. 13C.

Figure 13D:
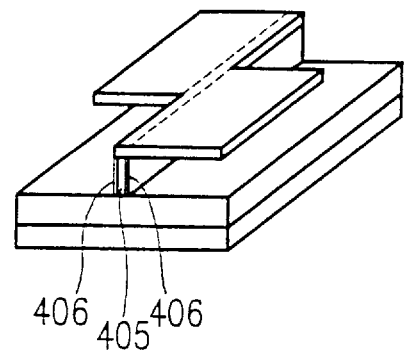

As shown in FIG. 13D, silicon oxide barriers 406 which are thin enough to allow electrons to pass therethrough by the tunnel effect (thickness: about 1.5 nm) are formed on the both side walls of the silicon thin plate 405 by thermal oxidation.

Figure 13E:
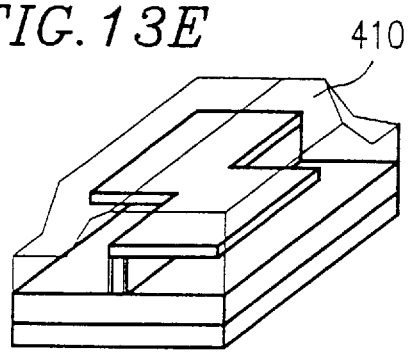
Figure 13F:
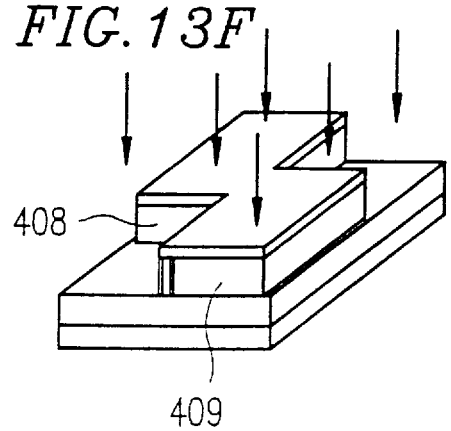

As shown in FIG. 13E, polysilicon 410 is deposited on the entire surface of the substrate and implanted with impurities. The deposited polysilicon 410 is dry-etched using the mask 404, so that a source 408 and a drain 409 as electrodes are formed under the mask 404 in a self-alignment fashion as shown in FIG. 13F.

As described above, the mask 404 is used as the mask for the etching of the polysilicon 410 in the step of forming the source 408 and the drain 409, as well as for etching the upper silicon layer in the step of forming the silicon thin plate 405. Accordingly, in the fabrication of a device with the configuration as shown in FIG. 13F, only one step is required for forming the mask required. In other words, no additional mask is required at the formation of the source and the drain.

In this example, therefore, the fabrication process can be simplified since only one step is required for forming the mask required. As in the preceding examples, the silicon thin plate 405 (semiconductor microstructure) can be formed with good controllability depending on the shape of the mask 404.

In this example, by using the SOI substrate having the buried silicon oxide layer 402, current leakage through the substrate can be prevented. The height of the silicon thin plate 405 to be formed later can be controlled by adjusting the thickness of the upper silicon layer 401 of the SOI substrate before the formation of the etching mask. Thus, the current can be set at an appropriate value by changing the area where the current flows, so as to adjust the capacitance between the source and drain electrodes and thereby improve the operation speed of the device. The same results can also be obtained by using a SIMOX substrate.

Thus, according to the present invention, the following effects can be obtained.

The width of the semiconductor microstructure to be formed can be easily controlled by adjusting the depth of the cuts of the etching control section of the etching mask. A very narrow semiconductor microstructure can be formed only by the control of the shape of the etching mask without being affected by the rate of the crystal anisotropic etching.

Since the cuts are formed on the opposite sides of the etching control section, the semiconductor microstructure can be formed without being cut halfway even if an angular error arises in the alignment of the etching mask with the orientation of the substrate.

The (111) walls of the semiconductor microstructure can be formed in a short time by use of faster etching in the <211> direction. A large temporal margin can be secured after the semiconductor microstructure is completed, since the etching rate in the <111> direction is slow.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for forming a semiconductor microstructure, comprising the steps of:

forming a mask pattern having a first opening and a second opening on a substrate having a semiconductor layer as an upper portion thereof; and selectively etching the semiconductor layer using the mask pattern to form a semiconductor microstructure extending in a first direction parallel to a surface of the substrate, wherein, in the step of selectively etching the semiconductor layer, an etching rate in a second direction vertical to the first direction and parallel to the surface of the substrate is substantially zero with respect to an etching rate in the first direction, and a width of the semiconductor microstructure is substantially equal to a shortest distance between the first opening and the second opening in the second direction.

2. A method for forming a semiconductor microstructure according to claim 1, wherein the orientation of the substrate is (110), the first direction is <211>, and the second direction is <111>.

3. A method for forming a semiconductor microstructure according to claim 1, wherein the substrate is an SOI substrate.

4. A method for forming a semiconductor microstructure according to claim 1, wherein the substrate is a SIMOX substrate.

5. A method for forming a semiconductor microstructure according to claim 1, wherein the mask pattern has a stripe-shaped portion between the first opening and the second opening, and a length direction of the stripe-shaped portion does not correspond to the first direction.

6. A method for forming a semiconductor microstructure according to claim 1, further comprising the step of forming a first oxide film and a second oxide film formed in parallel to each other in the first direction to sandwich the semiconductor layer, wherein, in the step of selectively etching the semiconductor layer, etching in the first direction is terminated by the first oxide film and the second oxide film.

7. A method for forming a semiconductor microstructure according to claim 1, wherein the semiconductor layer is made of Si.

8. A method for forming a semiconductor microstructure according to claim 1, wherein an oxide film is formed under the semiconductor layer of the substrate.

9. A method for forming a semiconductor microstructure according to claim 1, wherein the step of selectively etching the semiconductor layer includes crystal anisotropic etching.

10. A method for fabricating a resonance tunneling device including a silicon thin plate having side walls and a width thin enough to serve as a quantum well, a pair of tunnel barriers formed on the side walls of the silicon thin plate, and a pair of electrodes formed to sandwich the pair of tunnel barriers, wherein the silicon thin plate is formed in the steps of:

forming an oxide film having a first opening and a second opening on a substrate having a silicon layer as an upper portion thereof; and selectively etching the silicon layer using the oxide film as a mask to form the silicon thin plate extending in a first direction parallel to a surface of the substrate, wherein, in the step of selectively etching the silicon layer, an etching rate in a second direction vertical to the first direction and parallel to the surface of the substrate is substantially zero with respect to an etching rate in the first direction, and a width of the silicon thin plate is substantially equal to a shortest distance between the first opening and the second opening in the second direction.

11. A method for fabricating a resonance tunneling device according to claim 10, wherein the orientation of the substrate is (110), the first direction is <211>, and the second direction is <111>.

12. A method for fabricating a resonance tunneling device according to claim 10, wherein the substrate is an SOI substrate.

13. A method for fabricating a resonance tunneling device according to claim 10, wherein the substrate is a SIMOX substrate.

14. A method for fabricating a resonance tunneling device according to claim 10, wherein the mask pattern has a stripe-shaped portion between the first opening and the second opening, and a length direction of the stripe-shaped portion does not correspond to the first direction.

15. A method for fabricating a resonance tunneling device according to claim 10, further comprising the step of forming a first oxide film and a second oxide film formed in parallel to each other in the first direction to sandwich the semiconductor layer, wherein, in the step of selectively etching the silicon layer, etching in the first direction is terminated by the first oxide film and the second oxide film.

16. A method for fabricating a resonance tunneling device according to claim 10, wherein the step of selectively etching the silicon layer includes crystal anisotropic etching.

17. A method for fabricating a resonance tunneling device according to claim 10, wherein the pair of electrodes are formed by dry etching using the oxide film as a mask in a self-alignment fashion.

* * * * *